United States Patent [19]
Kim

[11] Patent Number: 6,111,278
[45] Date of Patent: Aug. 29, 2000

[54] POWER SEMICONDUCTOR DEVICES HAVING DISCONTINUOUS EMITTER REGIONS THEREIN FOR INHIBITING PARASITIC THYRISTOR LATCH-UP

[75] Inventor: Tae-Hoon Kim, Kyunggi-do, Rep. of Korea

[73] Assignee: Fairchild Korea Semiconductor, Ltd., Kyung-Ki, Rep. of Korea

[21] Appl. No.: 09/038,871

[22] Filed: Mar. 11, 1998

[30] Foreign Application Priority Data

May 7, 1997 [KR] Rep. of Korea ............. 97-17353

[51] Int. Cl.⁷ .................................. H01L 29/745
[52] U.S. Cl. .................. 257/144; 257/152; 257/164; 257/342; 257/401
[58] Field of Search .................... 257/144, 152, 257/164, 341, 342, 401

[56] References Cited

U.S. PATENT DOCUMENTS

| | | | |
|---|---|---|---|
| 3,753,055 | 8/1973 | Yamashita et al. | 317/235 R |
| 4,639,754 | 1/1987 | Wheatley | 257/144 |
| 4,831,424 | 5/1989 | Yoshida et al. | 357/23.13 |
| 4,980,740 | 12/1990 | Pattanayak et al. | 357/38 |
| 5,034,336 | 7/1991 | Seki | 437/29 |
| 5,057,884 | 10/1991 | Suzuki et al. | 357/23.4 |
| 5,089,864 | 2/1992 | Sakurai | 357/23.4 |
| 5,095,343 | 3/1992 | Klodzinski et al. | 357/23.4 |
| 5,136,349 | 8/1992 | Yilmaz et al. | 357/23.4 |
| 5,160,985 | 11/1992 | Akiyama | 257/145 |
| 5,170,239 | 12/1992 | Hagino | 257/139 |
| 5,198,687 | 3/1993 | Baliga | 257/137 |
| 5,210,432 | 5/1993 | Shinohe | 257/123 |
| 5,245,202 | 9/1993 | Yasukazu | 257/133 |
| 5,258,638 | 11/1993 | Elhatem et al. | 257/401 |
| 5,315,139 | 5/1994 | Endo | 257/409 |
| 5,323,036 | 6/1994 | Neilson et al. | 257/287 |
| 5,326,993 | 7/1994 | Iwamuro | 257/139 |
| 5,338,961 | 8/1994 | Lidow et al. | 257/342 |
| 5,349,212 | 9/1994 | Seki | 257/133 |
| 5,396,087 | 3/1995 | Baliga | 257/139 |
| 5,397,905 | 3/1995 | Otsuki et al. | 257/133 |
| 5,428,228 | 6/1995 | Ogura et al. | 257/138 |
| 5,444,273 | 8/1995 | Ueno | 257/138 |

(List continued on next page.)

OTHER PUBLICATIONS

Nandakumar et al., The Base Resistance Controlled Thyristor (BRT) *"A New MOS Gated Power Thyristor"*, IEEE, 1991, pp. 138–141.

*Primary Examiner*—Jerome Jackson, Jr
*Attorney, Agent, or Firm*—Grant J. Scott, Esq.; Pierce Atwood; Chris A. Caseiro

[57] ABSTRACT

Power semiconductor devices having discontinuous emitter regions therein include a semiconductor substrate containing therein a collector region of second conductivity type, a buffer region of first conductivity type which forms a first P-N junction with the collector region and a drift region of first conductivity type which forms a non-rectifying junction with the buffer region. A base region of second conductivity type is also provided in the drift region and forms a second P-N junction therewith. In addition, a base contact region of second conductivity type is provided in the base region of second conductivity type. The base contact region typically has a much higher second conductivity type doping concentration therein than the base region. A preferred emitter region is also provided in the substrate. This preferred emitter region comprises an emitter contact region which is entirely surrounded in the substrate by the highly doped base contact region and a carrier emitting region. This emitter contact region may comprise the central portion of an S, H or C-shaped emitter or one side of an L-shaped emitter. An insulated gate electrode is also provided. The insulated gate electrode provides turn-on and turn-off control by enabling the formation of a highly conductive inversion-layer channel of first conductivity type in the base region. This inversion-layer channel electrically connects the carrier emitting region to the drift region. A first electrode is also electrically coupled to the base contact region and the emitter contact region, and a second electrode is electrically coupled to the collector region.

24 Claims, 5 Drawing Sheets

U.S. PATENT DOCUMENTS

| | | | |
|---|---|---|---|
| 5,468,668 | 11/1995 | Neilson et al. | 437/51 |
| 5,475,243 | 12/1995 | Saito | 257/171 |
| 5,485,023 | 1/1996 | Sumida | 257/139 |
| 5,488,236 | 1/1996 | Baliga et al. | 257/132 |
| 5,490,095 | 2/1996 | Shimada et al. | 364/578 |
| 5,519,241 | 5/1996 | Oppermann et al. | 257/327 |
| 5,548,133 | 8/1996 | Kinzer | 257/155 |
| 5,563,439 | 10/1996 | Chung et al. | 257/365 |

POWER SEMICONDUCTOR DEVICES HAVING DISCONTINUOUS EMITTER REGIONS THEREIN FOR INHIBITING PARASITIC THYRISTOR LATCH-UP

CROSS-REFERENCE TO RELATED APPLICATION

This application is related to application Ser. No. 08/788,372, filed Jan. 27, 1997, entitled "METHODS OF FORMING POWER SEMICONDUCTOR DEVICES HAVING LATCH-UP INHIBITING REGIONS AND DEVICES FORMED THEREBY", the disclosure of which is hereby incorporated herein by reference.

FIELD OF THE INVENTION

The present invention relates to semiconductor devices and fabrication methods, and more particularly to power semiconductor devices and methods of forming power semiconductor devices.

BACKGROUND OF THE INVENTION

The development of semiconductor switching technology for high power applications in motor drive circuits, appliance controls and lighting ballasts, for example, began with the bipolar junction transistor. As the technology matured, bipolar devices became capable of handling large current densities in the range of 40–50 A/cm$^2$, with blocking voltages of 600 V.

Despite the attractive power ratings achieved by bipolar transistors, there exist several fundamental drawbacks to the suitability of bipolar transistors for all high power applications. First of all, bipolar transistors are current controlled devices. For example, a large control current into the base, typically one fifth to one tenth of the collector current, is required to maintain the device in an operating mode. Even larger base currents, however, are required for high speed forced turn-off. These characteristics make the base drive circuitry complex and expensive. The bipolar transistor is also vulnerable to breakdown if a high current and high voltage are simultaneously applied to the device, as commonly required in inductive power circuit applications, for example. Furthermore, it is difficult to parallel connect these devices since current diversion to a single device may occur at high temperatures, making emitter ballasting schemes necessary.

The power MOSFET was developed to address this base drive problem. In a power MOSFET, a gate electrode bias is applied for turn-on and turn-off control. Turn-on occurs when a conductive channel is formed between the MOSFET's source and drain regions under appropriate bias. The gate electrode is separated from the device's active area by an intervening insulator, typically silicon dioxide. Because the gate is insulated from the active area, little if any gate current is required in either the on-state or off-state. The gate current is also kept small during switching because the gate forms a capacitor with the device's active area. Thus, only charging and discharging current ("displacement current") is required. The high input impedance of the gate, caused by the presence of a gate insulator, is a primary feature of the power MOSFET. Moreover, because of the minimal current demands on the gate, the gate drive circuitry and devices can be easily implemented on a single chip. As compared to bipolar technology, the simple gate control provides for a large reduction in cost and a significant improvement in reliability.

These benefits are offset, to some extent, by the high on-resistance of the MOSFET's active region, which arises from the absence of minority carrier injection. As a result, the device's operating forward current density is limited to relatively low values, typically in the range of 10 A/cm$^2$, for a 600 V device, as compared to 40–50 A/cm$^2$ for the bipolar transistor.

On the basis of these features of power bipolar transistors and MOSFET devices, hybrid devices embodying a combination of bipolar current conduction with MOS-controlled current flow were developed and found to provide significant advantages over single technologies such as bipolar or MOSFET alone. Classes of such hybrid devices include various types of MOS-gated thyristors as well as the insulated gate bipolar transistor (IGBT), also commonly referred to by the acronyms COMFET (Conductivity-Modulated FET) and BIFET (Bipolar-mode MOSFET).

Examples of insulated gate bipolar transistors are described in U.S. Pat. Nos. 5,160,985 and 5,170,239 and in U.S. Pat. No. 5,273,917 to Sakurai; U.S. Pat. No. 5,331,184 to Kuwahara; U.S. Pat. No. 5,360,984 to Kirihata; U.S. Pat. Nos. 5,396,087 and 5,412,228 to B. J. Baliga; U.S. Pat. No. 5,485,022 to Matsuda; U.S. Pat. No. 5,485,023 to Sumida; U.S. Pat. No. 5,488,236 to Baliga et al.; and U.S. Pat. No. 5,508,534 to Nakamura et al. In particular, U.S. Pat. No. 5,360,984 to Kirihata discloses a semiconductor substrate containing an IGBT therein and a freewheeling/flyback diode for, among other things, bypassing parasitic reverse voltage surges which are typical in inductive power circuit applications. However, the antiparallel-connected freewheeling diode disclosed by Kirihata increases the area occupied by the IGBT and may cause an unnecessary stray inductance due to the wiring which interconnects the IGBT with the freewheeling diode. Moreover, the IGBT of Kirihata may be susceptible to sustained parasitic thyristor latch-up.

As will be understood by those skilled in the art, the parasitic thyristor latch-up phenomenon serves as a main factor in limiting the amount of gate-controllable forward current an IGBT cell can handle. FIG. 1 illustrates a layout schematic of a conventional n-channel IGBT cell and FIG. 2 illustrates a cross-sectional view of the IGBT of FIG. 1, taken along line 2—2'. Referring now to FIGS. 1 and 2, an N$^+$-type buffer layer 12 is formed on a major surface of a P$^+$-type collector layer 10 (e.g., P$^+$-type semiconductor substrate). An N$^-$-type epitaxial layer 14 is formed on a surface of the N$^+$-type buffer layer 12 and forms a nonrectifying junction therewith. A P-type well region or base region is partially formed in the surface of the N$^-$-type epitaxial layer 14 by selectively diffusing a P-type impurity into the epitaxial layer 14. As illustrated, the P-type well region is formed by a shallow P-type well region 16 having a relatively low P-type impurity concentration therein and a deep P-type well region 18 (e.g., contact region) having a relatively high impurity concentration therein. The deep P-type well region 18 is provided in a central portion of the shallow P-type well region 16. An N$^+$-type emitter region 20 may also be formed at the surface of the P-type well region by selectively diffusing N-type impurities therein.

A gate insulating film 22 is formed on the surface of the P-type well region, as illustrated. A gate electrode 24 is also formed on the gate insulating film 22, and a conductive emitter electrode 27 is formed in electrical contact with the N$^+$-type emitter region 20 and P-type well region. A conductive collector electrode (not shown) may also be formed on the P$^+$-type collector layer 10. In this IGBT device, the gate insulating film 22 and gate electrode 24 form a MOS insulated gate electrode which extends opposite a portion of the P-type well region that extends between the N⁻-type epitaxial layer 14 and the N⁺-type emitter region 20 (i.e., the "channel" region). As will be understood by those skilled in the art, a positive voltage may be applied to the gate electrode 24 to cause the formation of a low resistance inversion-layer channel in the channel region. During forward on-state conduction, this inversion layer channel provides a highly conductive path for electrons to travel from the emitter region 20 to the epitaxial layer 14. Symbol $I_e$ of FIG. 2 indicates the direction of flow of the electron current.

During forward on-state conduction, positive holes are also injected from the P⁺-type collector layer 10 into the N⁻-type epitaxial layer 14 as minority carriers. A portion of these holes recombine with the electrons that pass through the channel region and enter the epitaxial layer 14, however the remaining holes are collected by the P-type well region as hole current $I_h$. Thus, the IGBT basically operates like a conventional bipolar junction transistor, however, the conductivity of the N⁻-type epitaxial layer 14 (i.e., floating base region) can be increased due to a conductivity modulation effect. Thus, an IGBT can have lower on-state voltage drop and larger current carrying capacity than a conventional power MOS device.

Unfortunately, conventional IGBT devices typically include parasitic PNPN thyristor structures therein. This parasitic thyristor structure may be formed by two regeneratively cross-coupled bipolar junction transistors. Here, for example, an NPN bipolar junction transistor may be defined by the N⁻-type epitaxial layer 14, the P-type well region and the N⁺-type emitter region 20 and a PNP bipolar junction transistor may be defined by the P⁺-type collector layer 10, the N⁻-type epitaxial layer 104 and the P-type well region. As will be understood by those skilled in the art, these cross-coupled bipolar junction transistors may latch-up and cause sustained parasitic conduction if the forward on-state current in the IGBT device become excessive. This sustained parasitic thyristor conduction may not be prevented by merely removing any on-state gate bias applied to the gate electrode 24.

Sustained parasitic conduction may occur if the P-N junction between the P-type well region 16 and N-type source region 20 becomes forward biased. Such forward biasing may occur if the amount of hole current $I_h$ flowing directly underneath the N⁺-type emitter region 20 in a lateral direction exceeds a particular level and causes the voltage underneath the N-type emitter region 20 to increase to a level sufficient to forward bias the P-N junction and turn on the NPN bipolar junction transistor. Turn-on of the NPN bipolar junction transistor can also induce turn on of the PNP bipolar junction transistor in such a manner that a sustainable regenerative forward current is established through the IGBT device. If this regenerative forward current is excessive, the performance and lifetime of the IGBT device may be severely degraded.

Many attempts have been made to make IGBT devices less susceptible to parasitic thyristor latch-up. One such attempt includes the use of a highly doped central P+ well region 18 (e.g., contact region) so that the total lateral series resistance underneath the N-type source region 20 is maintained at a low level. If the series resistance is low enough, the P-N junction between the P-type well region and N-type source region 20 may not become forward biased during forward conduction. In order to form the highly doped P-type contact region 18 in FIG. 2, the P-type well region 16 must be deeply formed (for a high breakdown voltage device) and the P⁺-type well region 18 must also be deeply formed. However, since the P⁺-type well region 18 is typically formed by diffusion of P-type impurities from the surface, the concentrations of the P-type impurities fall off as the depth of the P-type well region is increased. Thus, the resistance of the P-type well region underneath the N-type source region 20 may not be sufficiently reduced. Moreover, increasing the concentration of P-type impurities in the P-type well region 16 may increase the concentration of P-type dopants in the channel region and such an increase may increase the threshold voltage of the MOS control transistor beyond an acceptable level.

Thus, notwithstanding these attempts to form IGBTs, there still continues to be a need for methods of forming highly integrated power semiconductor devices having reduced susceptibility to sustained parasitic thyristor latch-up.

SUMMARY OF THE INVENTION

It is therefore an object of the present invention to provide improved power semiconductor devices.

It is another object of the present invention to provide power semiconductor devices which have reduced susceptibility to sustained parasitic thyristor latch-up.

It is a further object of the present invention to provide power semiconductor devices having low on-state voltage drop.

It is still a further object of the present invention to provide power semiconductor devices having high blocking voltage capability.

These and other objects, features and advantages of the present invention are provided by power semiconductor devices which contain discontinuous emitter regions so that susceptibility to parasitic thyristor latch-up is reduced. According to one embodiment of the present invention, a PNP insulated-gate bipolar junction transistor (IGBT) is provided with S-shaped, C-shaped, L-shaped or H-shaped emitters which contain stripe-shaped segments. By using emitters with segments which collectively form discontinuous stripe-shaped patterns, a large percentage of total hole current collected by the base region of the IGBT can bypass the region directly underneath the emitter. Accordingly, this hole current does not contribute to the forward biasing of the base/emitter P-N junction which can initiate parasitic thyristor latch-up. According to a preferred aspect of the present invention, each of these segments may be connected to another parallel segment by an emitter contact region which is entirely surrounded by a highly doped base contact region.

In particular, a preferred IGBT can be formed as a vertical or lateral power device in a semiconductor substrate. The IGBT may comprise a semiconductor substrate containing therein a collector region of second conductivity type, a buffer region of first conductivity type which forms a first P-N junction with the collector region and a drift region of first conductivity type which forms a non-rectifying junction with the buffer region. A base region of second conductivity type is also provided in the drift region and forms a second P-N junction therewith. In addition, a base contact region of second conductivity type is provided in the base region of second conductivity type. The base contact region typically has a much higher second conductivity type doping concentration therein than the base region. A preferred emitter region is also provided in the substrate. This preferred emitter region comprises an emitter contact region which is entirely surrounded in the substrate by the highly doped base contact region and a carrier emitting region. This emitter contact region may comprise the central portion of an S, H or C-shaped emitter or one side of an L-shaped emitter. An insulated gate electrode is also provided. The insulated gate electrode provides turn-on and turn-off control by enabling the formation of a highly conductive inversion-layer channel of first conductivity type in the base region. This inversion-layer channel electrically connects the carrier emitting region to the drift region. A first electrode is also electrically coupled to the base contact region and the emitter contact region, and a second electrode is electrically coupled to the collector region.

DESCRIPTION OF PREFERRED EMBODIMENTS

Figure 1:
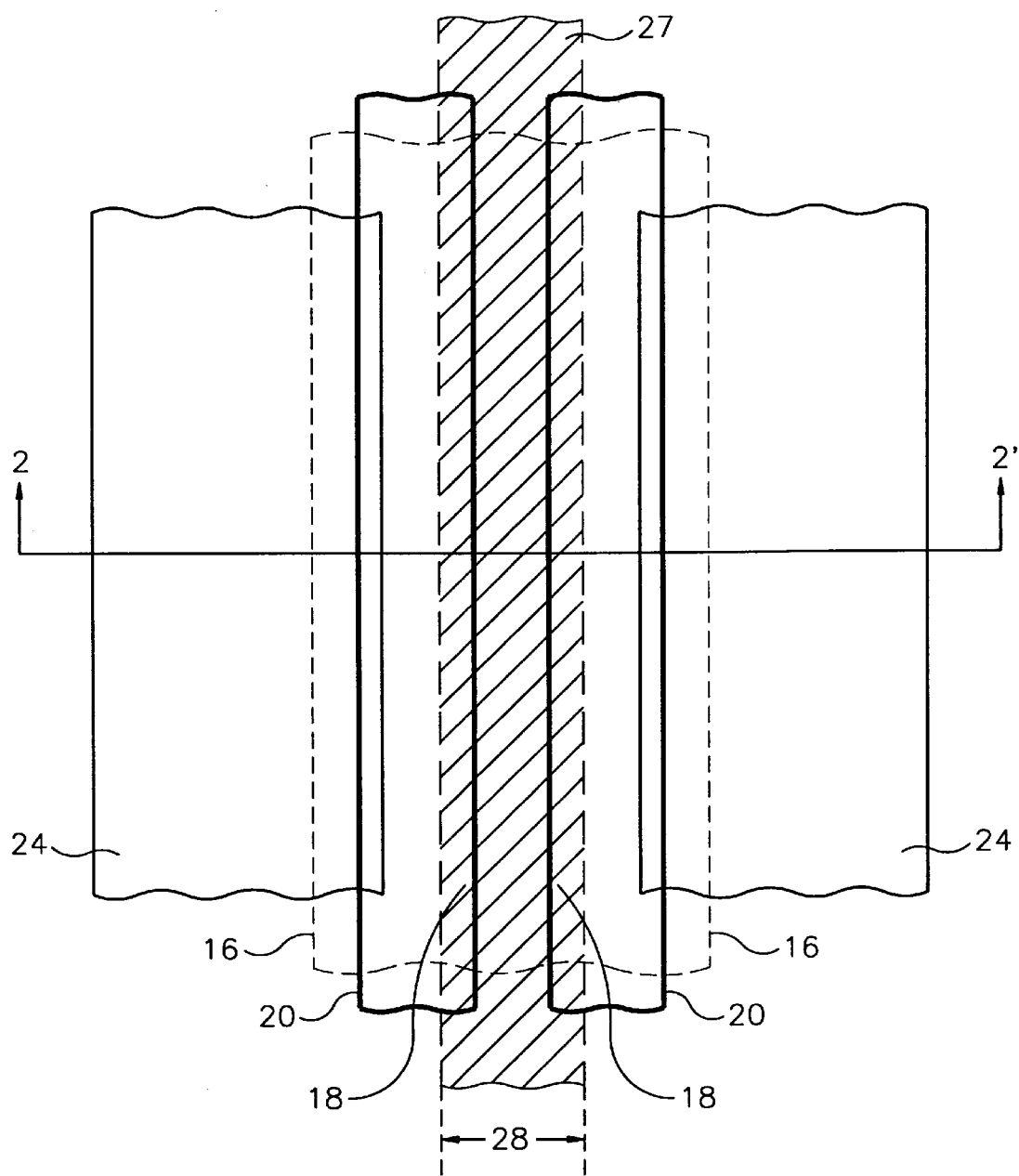
FIG. 1 illustrates a layout view of an insulated-gate bipolar transistor (IGBT), according to the prior art.
Figure 2:
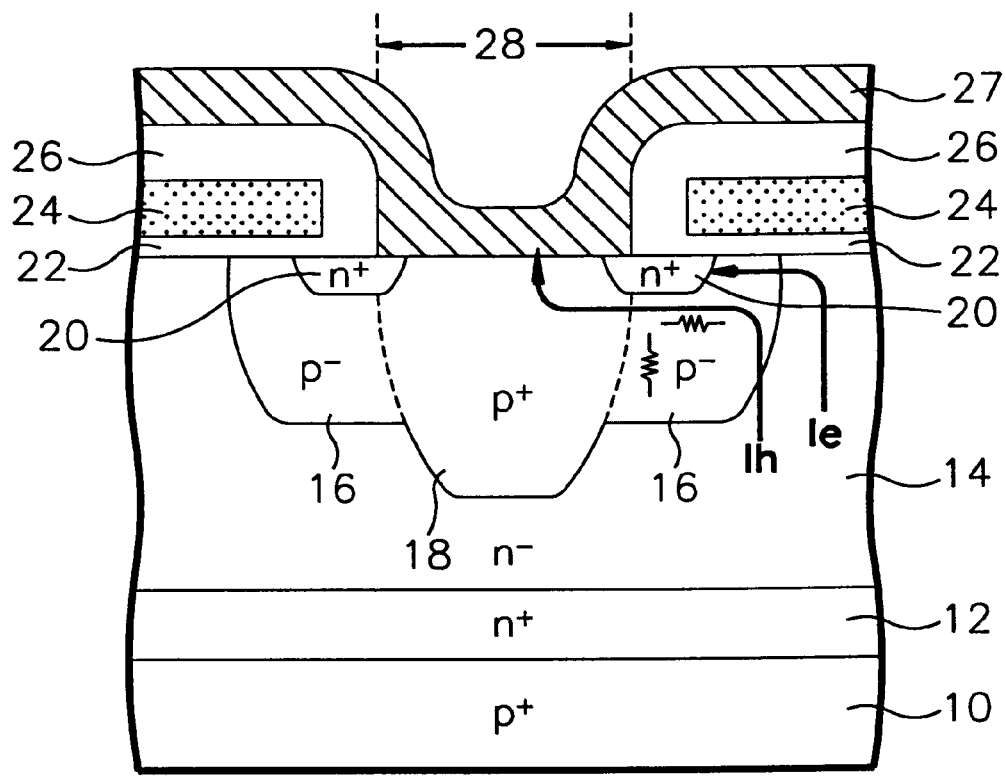
FIG. 2 illustrates a schematic cross-sectional view of the IGBT of FIG. 1.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type and each embodiment described and illustrated herein includes its complementary embodiment as well.

Figure 3:
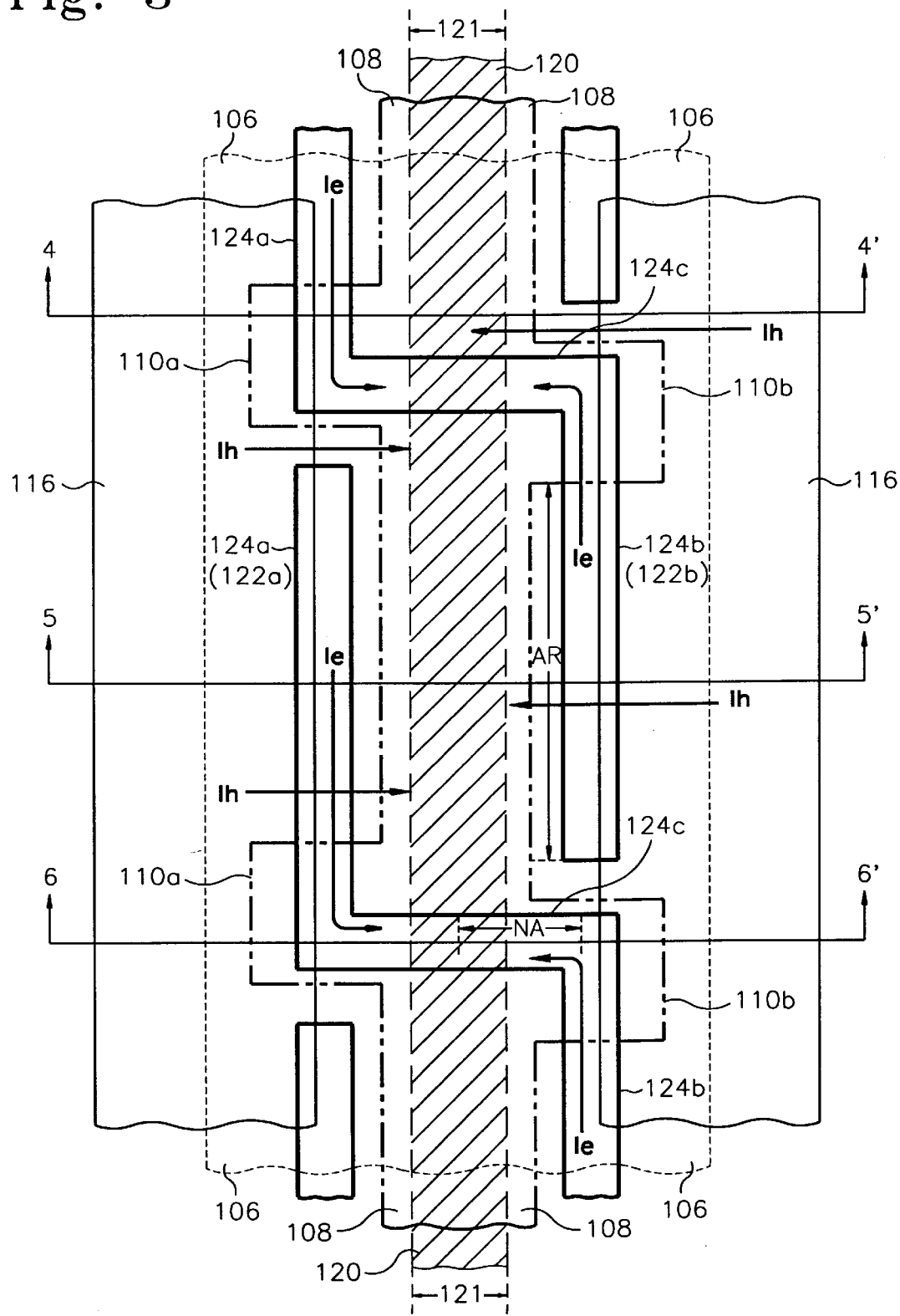
FIG. 3 illustrates a layout view of a power semiconductor device, according to a first embodiment of the present invention.
Figure 4:
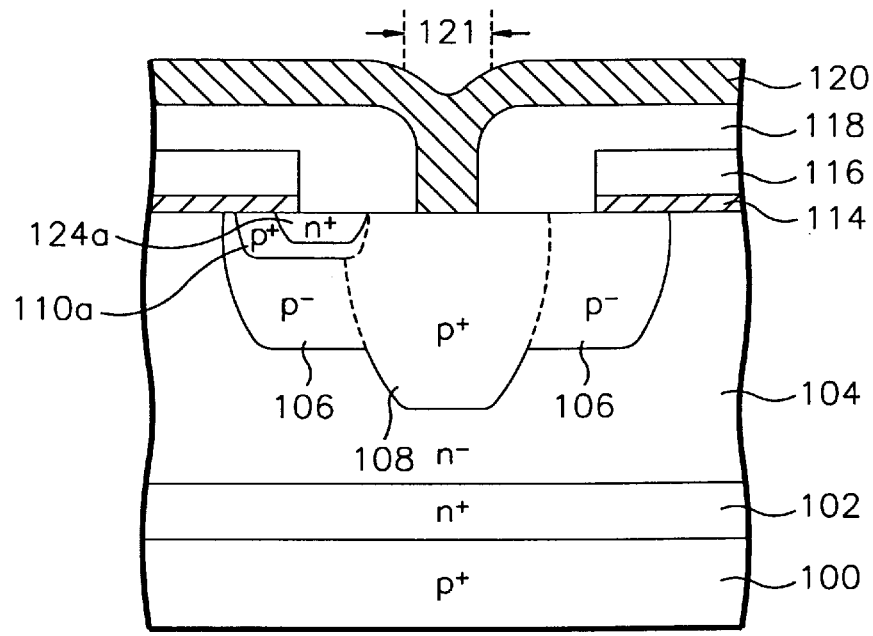
FIG. 4 illustrates a schematic cross-sectional view of the power semiconductor device of FIG. 3, taken along line 4-4'.
Figure 5:
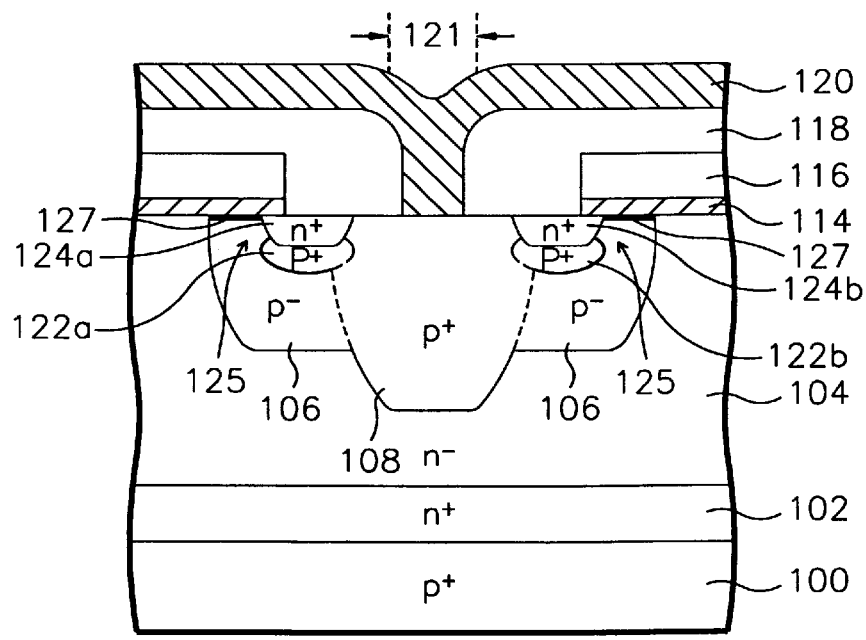
FIG. 5 illustrates a schematic cross-sectional view of the power semiconductor device of FIG. 3, taken along line 5-5'.
Figure 6:
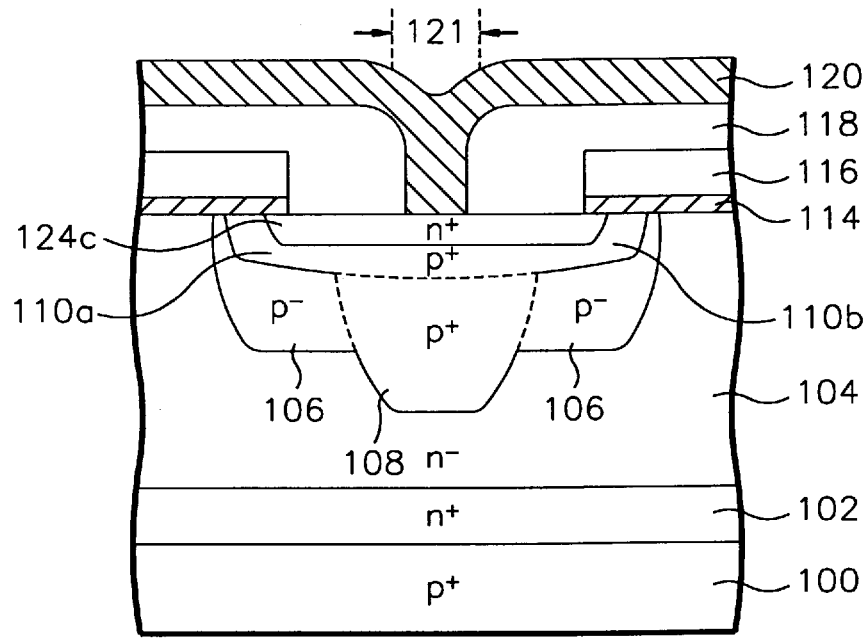
FIG. 6 illustrates a schematic cross-sectional view of the power semiconductor device of FIG. 3, taken along line 6-6'.
Figure 7:
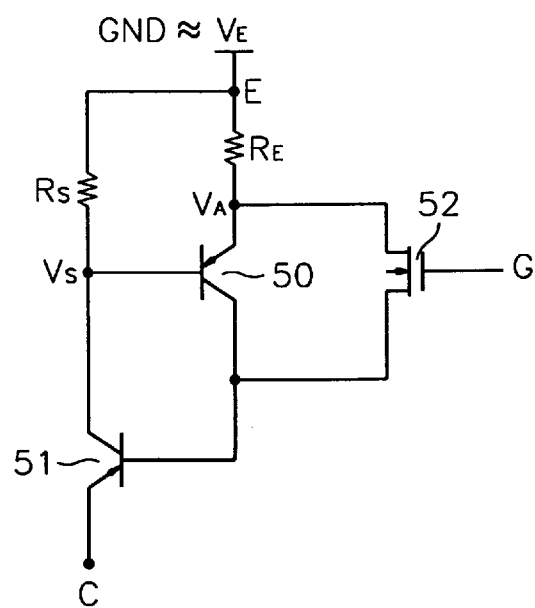
FIG. 7 is an electrical schematic view of the power semiconductor device of FIG. 3.

Referring now to FIGS. 3–6, a preferred multi-celled semiconductor switching device according to a first embodiment of the present invention will be described. The preferred switching device is illustrated as a multi-celled insulated-gate bipolar junction transistor (IGBT). In FIG. 3, a layout view of an IGBT having S-shaped emitters is provided. FIGS. 4–6 illustrate schematic cross-sectional views of the IGBT of FIG. 3, taken along lines 4-4', 5-5' and 6-6', respectively. FIG. 7 illustrates an electrical schematic view of the IGBT of FIG. 3 where numeral 52 denotes the insulated-gate FET which controls turn-on and turn-off of the IGBT, numerals 50 and 51 denote the regeneratively coupled NPN and PNP transistors, respectively, resistor $R_s$ represents the base resistance and resistor $R_e$ represents the emitter resistance.

As illustrated best by FIG. 3, each of the S-shaped emitters contain a pair of parallel segments 124a and 124b and a central portion 124c which electrically connect the segments together. The parallel emitter segments 124a and 124b collectively form a carrier (e.g., electron) emitting region and the central portion 124c forms an emitter contact region which is entirely surrounded in the substrate by a base contact region 108, 110a and 110b. In contrast to the emitter contact region, the parallel emitter segments 124a and 124b are not entirely surrounded by the base contact region 108, 110a and 110b or latch-up inhibiting regions 122a and 122b. Instead, the emitter segments 124a and 124b extend adjacent a more lightly doped base region 106 and form respective P-N junctions therewith.

As illustrated best by FIGS. 4–6, the preferred IGBT may be formed as a vertical device having a collector region 100 (C in FIG. 7) of second conductivity type (e.g., P-type) therein, a relatively highly doped buffer region 102 of first conductivity type (e.g., N-type) which forms a first P-N junction with the collector region 100 and a more lightly doped drift region 104 of first conductivity type which forms a non-rectifying junction with the buffer region 102. A base region 106 of second conductivity type is also provided in the drift region 104 and forms a second P-N junction therewith. In addition, a base contact region, collectively formed by regions 108, 110a and 110b of second conductivity type, is provided in the base region of second conductivity type. The base contact region typically has a much higher second conductivity type doping concentration therein than the base region 106. A preferred emitter (E in FIG. 7) is also provided in the substrate. This preferred emitter comprises an emitter contact region 124c which is entirely surrounded in the substrate by the highly doped base contact region 108, 110a and 110b, and carrier emitting regions 124a and 124b. According to a preferred aspect of the present invention, this emitter contact region 124c may comprise the central portion of an S, H or C-shaped emitter or one side of an L-shaped emitter. Highly doped latch-up inhibiting regions 122a and 122b may also be provided in the base region 106 to provide further latch-up improvement, as illustrated best by FIGS. 3 and 5. These latch-up inhibiting regions 122a and 122b extend opposite the carrier emitting regions 124a and 124b and form P-N junctions therewith. As will be understood by those skilled in the art, the latch-up inhibiting regions 122a and 122b may be considered as extensions of the portions 110a and 110b of the base contact region. The latch-up inhibiting regions 122a and 122b and carrier emitter regions 124a and 124b may also be formed using the same mask. These and other aspects of the latch-up inhibiting regions are more fully described in commonly assigned U.S. application Ser. No. 08/788,372, filed Jan. 27, 1997, entitled "Methods of Forming Power Semiconductor Devices Having Latch-up Inhibiting Regions and Devices Formed Thereby" (Attorney Docket No. 5649-66), the disclosure of which is hereby incorporated herein by reference.

An insulated gate electrode (G in FIG. 7) is also provided. The insulated gate electrode is provided by a first electrically insulating layer 114 and a gate electrode 116 on the first electrically insulating layer 114. A second electrically insulating layer 118 is also provided and a stripe-shaped contact hole 121 is formed therein to expose portions of the base contact region 108 and the emitter contact region 124c. An emitter electrode 120 may also extend into the contact hole 121 and ohmically contact the base contact region 108 and the emitter contact region 124c. Similarly, a collector electrode (not shown) may be provided in ohmic contact with the collector region 100.

Referring still to FIGS. 3–6, operation of the preferred IGBT includes the steps of establishing a forward bias across the IGBT by biasing the electrode connected to the collector region 100 positive relative to the electrode connected to the emitter contact region 124c and base contact region 108, and then applying a sufficiently positive bias to the gate electrode 116 so that a conductivity of a portion of the base region 106 extending opposite the gate electrode 116 becomes inverted and forms an inversion-layer channel 127. This portion of the base region is commonly referred to as the channel region 125, and is best illustrated by FIG. 5. The establishment of the forward bias and the inversion layer channel initiates a transfer of electrons from the emitter electrode 120 to the central portion 124c of the emitter. The electrons are then transferred from the central portion 124c of the emitter to the parallel emitter segments 124a and 124b. These segments form the active portions (AR in FIG. 3) of each emitter. Because these parallel emitter segments 124a and 124b are electrically connected to the drift region 104 by the inversion-layer channels 127, the electrons received by the parallel emitter segments 124a and 124b traverse the inversion-layer channels 127 and are injected into the drift region 104 as $I_e$. The potential of the parallel emitter segments 124a and 124b are illustrated as $V_A$ in FIG. 7.

The establishment of the forward bias also causes the injection of holes into the drift region 104. These holes are provided by the collector region 100. As will be understood by those skilled in the art, some of the injected holes recombine with the injected electrons $I_e$, however, a majority of the holes are collected as hole current $I_h$ by the base region 106 and base contact region 108. As illustrated best by FIGS. 3, 4 and 6, some of the hole current collected by the base region 106 may be transferred to the base contact region 108 and emitter electrode 120 without traversing underneath the parallel emitter segments 124a and 124b. For example, a large percentage of the collected hole current may traverse underneath the emitter contact region 124c (see, e.g., FIG. 6) or underneath portions of the emitter segments 124a and 124c which are surrounded by the more highly doped base contact region 110a and 110b (see, e.g., FIG. 4) and more highly doped latch-up inhibiting regions 122a and 122b. Thus, a large percentage of the collected hole current may be able to bypass portions of the emitter/base junction which are most susceptible to premature turn-on and initiation of parasitic thyristor latch-up. Here, the potential of the base region is illustrated as $V_s$ in FIG. 7. In addition, because the electron current must traverse the central portion of each emitter (i.e., the non-active area NA in FIG. 3), there will be some voltage drop between the emitter contact region 124c and the parallel emitter segments 124a and 124b. As will be understood by those skilled in the art, this voltage drop, in combination with the reduced lateral voltage drop in the base region 106 (because of the presence of the base contact regions 108 and 110a and 110b and latch-up inhibiting regions 122a and 122b), will cause the potential across the P-N junction formed between the base region 106 and the emitter (i.e., $V_{be}$ of the NPN transistor 50 in the parasitic thyristor) to be reduced even during high forward current operation.

Thus, by forming the emitters to contain central portions which are entirely surrounded by a more highly doped contact portion of the base region and contain parallel segments which terminate between each unit cell of the IGBT, a large percentage of the collected hole current can be made to bypass those portions of the emitter which are most vulnerable to parasitic conduction (i.e., those portions of the emitter which extend opposite the channel regions 125 in the base region). Accordingly, the power semiconductor devices of the present invention, which include IGBTs for example, can be made to have reduced susceptibility to parasitic thyristor latch-up.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:
1. A semiconductor switching device, comprising:
   a semiconductor substrate containing a drift region of first conductivity type therein;
   a base region of second conductivity type in the drift region and forming a first P-N junction therewith;
   a base contact region of second conductivity type in said base region of second conductivity type, said base contact region having a higher second conductivity type doping concentration therein than said base region;
   an emitter of first conductivity type in said substrate, said emitter comprising an emitter contact region which is entirely surrounded in said substrate by said base contact region and forms a second P-N junction therewith, and a carrier emitting region which forms a third P-N junction with said base region;
   means, responsive to a gate bias signal, for forming a conductive channel of first conductivity type in said base region which electrically connects the carrier emitting region to the drift region; and
   a first electrode electrically and physically coupled to said base contact region and said emitter contact region but not physically coupled to said carrier emitting region.
2. The semiconductor switching device of claim 1, wherein the emitter contact region extends between the first electrode and the carrier emitting region.
3. The semiconductor switching device of claim 2, wherein the carrier emitting region forms a fourth P-N junction with said base contact region.
4. The semiconductor switching device of claim 1, wherein the carrier emitting region forms a fourth P-N junction with said base contact region.
5. The semiconductor switching device of claim 1, wherein said emitter is an S-shaped, C-shaped, L-shaped or H-shaped semiconductor region of first conductivity type.
6. The semiconductor switching device of claim 1, wherein said emitter comprises an S-shaped, C-shaped or H-shaped semiconductor region of first conductivity type having two parallel stripe-shaped regions therein which define the carrier emitting region.
7. The semiconductor switching device of claim 6, wherein the two parallel stripe-shaped regions are electrically connected to each other by the emitter contact region.
8. An insulated-gate bipolar junction transistor, comprising:
   a semiconductor substrate containing therein a collector region of second conductivity type, a buffer region of first conductivity type which forms a first P-N junction with the collector region and a drift region of first conductivity type which forms a non-rectifying junction with the buffer region;
   a base region of second conductivity type in the drift region and forming a second P-N junction therewith;
   a base contact region of second conductivity type in said base region of second conductivity type, said base contact region having a higher second conductivity type doping concentration therein than said base region;
   an emitter of first conductivity type in said substrate, said emitter comprising an emitter contact region which is entirely surrounded in said substrate by said base contact region and forms a third P-N junction therewith, and a carrier emitting region which forms a fourth P-N junction with said base region;

means, responsive to a gate bias signal, for forming a conductive channel of first conductivity type in said base region which electrically connects the carrier emitting region to the drift region;

a first electrode electrically and physically coupled to said base contact region and said emitter contact region but not physically coupled to said carrier emitting region; and a second electrode electrically coupled to said collector region.

9. The transistor of claim 8, wherein said collector region extends adjacent a first face of said semiconductor substrate; and wherein said base region extends adjacent a second face of said semiconductor substrate.

10. The transistor of claim 8, wherein the emitter contact region extends between the first electrode and the carrier emitting region.

11. The transistor of claim 10, wherein the carrier emitting region forms a fourth P-N junction with said base contact region.

12. The transistor of claim 8, wherein the carrier emitting region forms a fourth P-N junction with said base contact region.

13. The transistor of claim 8, wherein said emitter is an S-shaped, C-shaped, L-shaped or H-shaped semiconductor region of first conductivity type.

14. The transistor of claim 8, wherein said emitter comprises an S-shaped, C-shaped or H-shaped semiconductor region of first conductivity type having two parallel stripe-shaped regions therein which define the carrier emitting region.

15. The transistor of claim 14, wherein the two parallel stripe-shaped regions are electrically connected to each other by the emitter contact region.

16. The transistor of claim 9, wherein the emitter contact region extends between the first electrode and the carrier emitting region.

17. The transistor of claim 16, wherein the carrier emitting region forms a fourth P-N junction with said base contact region.

18. The transistor of claim 9, wherein the carrier emitting region forms a fourth P-N junction with said base contact region.

19. The transistor of claim 9, wherein said emitter is an S-shaped, C-shaped, L-shaped or H-shaped semiconductor region of first conductivity type.

20. The transistor of claim 9, wherein said emitter comprises an S-shaped, C-shaped or H-shaped semiconductor region of first conductivity type having two parallel stripe-shaped regions therein which define the carrier emitting region.

21. The semiconductor switching device of claim 1, further comprising a latch-up inhibiting region of second conductivity type in said base region underlying said carrier emitting region, with said latch-up inhibiting region having a higher second conductivity type doping concentration than said base region.

22. The semiconductor switching device of claim 6 wherein said emitter is an S-shaped semiconductor region.

23. The transistor of claim 8, further comprising a latch-up inhibiting region of second conductivity type in said base region underlying said carrier emitting region, with said latch-up inhibiting region having a higher second conductivity type doping concentration than said base region.

24. The transistor of claim 14, wherein said emitter is an S-shaped semiconductor region.

* * * * *